(12) United States Patent
Nishikawa et al.

(10) Patent No.: US 9,287,527 B2
(45) Date of Patent: Mar. 15, 2016

(54) ORGANIC EL LIGHT EMITTING ELEMENT AND METHOD FOR MANUFACTURING SAME

(75) Inventors: Akira Nishikawa, Kamikita-gun (JP); Hideo Yamagishi, Kamikita-gun (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 13/979,637

(22) PCT Filed: Jan. 6, 2012

(86) PCT No.: PCT/JP2012/050180
§ 371 (c)(1),
(2), (4) Date: Jul. 12, 2013

(87) PCT Pub. No.: WO2012/096232
PCT Pub. Date: Jul. 19, 2012

(65) Prior Publication Data
US 2013/0285037 A1    Oct. 31, 2013

(30) Foreign Application Priority Data

Jan. 13, 2011  (JP) ................. 2011-005126

(51) Int. Cl.
*H01L 29/08*   (2006.01)
*H01L 51/56*   (2006.01)
*H01L 51/52*   (2006.01)

(52) U.S. Cl.
CPC ............ *H01L 51/56* (2013.01); *H01L 51/5212* (2013.01); *H01L 51/5228* (2013.01)

(58) Field of Classification Search
USPC ............................................ 257/40; 313/504
See application file for complete search history.

(56) References Cited

U.S. PATENT DOCUMENTS 6,136,622 A    10/2000    Fukuzawa et al.
7,510,885 B2    3/2009    Halls et al.
(Continued)

FOREIGN PATENT DOCUMENTS

CN    101213686 A    7/2008
JP    11162639 A    6/1999
(Continued)

OTHER PUBLICATIONS

International Bureau of WIPO, International Preliminary Report on Patentability of PCT/JP2012/050180, WIPO, Jul. 25, 2013, 9 pages.
(Continued)

*Primary Examiner* — Cuong Q Nguyen
*Assistant Examiner* — Nishath Yasmeen
(74) *Attorney, Agent, or Firm* — Alleman Hall McCoy Russell & Tuttle LLP (57) ABSTRACT

Provided is an organic EL light emitting element that prevents variations in brightness caused by resistance in a transparent electrode layer without a separate auxiliary electrode being provided. This organic EL light emitting element has a transparent conductive layer, organic light emitting unit layer, and metal layer in that order on a transparent substrate. The metal layer is divided into negative electrode regions and auxiliary electrode regions that are electrically separated by a metal layer dividing channel. In the auxiliary electrode regions, the metal layer and transparent electrode layer are electrically connected via first type connecting channels, which are opening parts in the organic light emitting unit layer. The dividing channels and connecting channels are preferably formed by laser beam irradiation.

3 Claims, 5 Drawing Sheets

(56) References Cited

U.S. PATENT DOCUMENTS

| | | | |
|---|---|---|---|
| 7,666,707 B2 | 2/2010 | Nakayama et al. | |
| 7,982,211 B2 * | 7/2011 | Buchel et al. | H01L 51/0021 257/40 |
| 8,120,021 B2 | 2/2012 | Nakayama et al. | |
| 2006/0152833 A1 | 7/2006 | Halls et al. | |
| 2007/0080356 A1 | 4/2007 | Nakayama et al. | |
| 2010/0097411 A1 | 4/2010 | Nakayama et al. | |
| 2011/0241029 A1 | 10/2011 | An | |
| 2012/0104942 A1 | 5/2012 | Nakayama et al. | |

FOREIGN PATENT DOCUMENTS

| | | | |
|---|---|---|---|
| JP | 2003-123990 | * | 4/2003 |
| JP | 2003123990 A | * | 4/2003 |
| JP | 2006511073 A | | 3/2006 |
| JP | 2007-026932 A | * | 2/2007 |
| JP | 2007026932 A | * | 2/2007 |
| JP | 2007052966 A | | 3/2007 |
| JP | 2011222485 A | | 11/2011 |
| WO | 2011021448 A | | 2/2011 |
| WO | WO 2011/024951 | * | 3/2011 |

OTHER PUBLICATIONS

Japanese Patent Office, International Search Report of PCT/JP2012/050180, Feb. 21, 2012, WIPO, 4 pages.

* cited by examiner

ORGANIC EL LIGHT EMITTING ELEMENT AND METHOD FOR MANUFACTURING SAME

TECHNICAL FIELD

The present invention relates to an organic electroluminescence (EL) element that is anticipated to have wide application as a surface-emitting light source.

BACKGROUND ART

An organic EL element constituting an organic EL device is a semiconductor element that converts electric energy into optical energy. In recent years, research using organic EL elements has been carried out in an accelerated manner and, by improvement in the organic materials and the like constituting the organic EL elements, outstanding reduction in the driving voltage of the elements is achieved, and also light-emission efficiency is enhanced.

An organic EL element has a construction such that an organic light-emitting unit layer is interposed between the positive electrode and the negative electrode for applying voltage. At least one of the positive electrode and the negative electrode is made of a transparent conductive material for emitting the light generated within the element to the outside. Typically, a transparent conductive layer is used as the positive electrode, and the light is emitted from the positive electrode side. As a material of the transparent conductive layer, for example, an extremely thin film of a metal such as Ag or Au, or a metal oxide such as indium tin oxide (ITO) or aluminum-doped zinc oxide (AZO) is used. These transparent conductive materials generally have a higher resistance as compared with materials constituting the metal electrode layer that does not require transparency, and an electric potential difference that varies with the distance from an electric current supplying terminal (typically, a positive electrode terminal) is generated within the film surface. For this reason, at parts that are distant from the electric current supplying terminal, the voltage applied to the organic light-emitting unit layer drops, leading to decrease in the brightness as compared with parts closer to the electric current supplying terminal. In particular, in an illumination device, it often happens that the whole surface of the element is configured to emit light at the same brightness, so that, when the element is configured to have a larger area, there will be variations in the brightness in the light-emitting region of the illumination device because of a decrease in the brightness in the region where the voltage drop has occurred.

As means for solving this problem, a method of providing an auxiliary electrode layer made of a metal having a good electric conductivity together in the transparent conductive layer is proposed (for example, Patent Document 1). However, with such a construction, there is a need to form an auxiliary electrode layer separately from the transparent conductive layer functioning as a positive electrode and the metal layer functioning as a negative electrode. Moreover, there is a need to provide an insulating layer for preventing conduction between the auxiliary electrode layer and the metal electrode layer. Also, there is a need to pattern the auxiliary electrode layer with use of a mask or the like, thereby raising a problem of making the production steps cumbersome.

PRIOR ART DOCUMENTS

Patent Documents

Patent Document 1: JP-A-2006-511073

SUMMARY OF THE INVENTION

Problems to be Solved by the Invention

An object of the present invention is to provide an organic EL light-emitting element that can suppress variations in brightness caused by resistance in a transparent conductive layer without providing a separate auxiliary electrode layer.

Means for Solving the Problems

A light-emitting element of the present invention has a transparent conductive layer, an organic light-emitting unit layer, and a metal layer in this order on a transparent substrate. The metal layer is divided into a negative electrode region and an auxiliary electrode region. The auxiliary electrode region of the metal layer is electrically connected to the transparent conductive layer. In this manner, the influence of the voltage drop caused by a comparatively higher resistance of the transparent conductive layer is reduced because the auxiliary electrode region of the metal layer, having a lower resistance as compared with the transparent conductive layer, is electrically connected to the transparent conductive layer, which is a positive electrode, in a non-light-emitting region.

The electrical connection between the auxiliary electrode region of the metal layer and the transparent conductive layer can be achieved by forming a first-type connecting channel, which is an opening part, in the organic light-emitting unit layer. In other words, because the inside of this connecting channel is filled with the metal constituting the metal layer, the transparent conductive layer constituting the positive electrode and the metal layer are electrically connected, whereby the resistance in the transparent conductive layer is substantially lowered. Accordingly, the variations in brightness, that is, a state of darkening of the parts located distant from the electric current supplying terminal, can be reduced. From the viewpoint of reducing the variations in brightness, the first-type connecting channel is preferably formed in two or more directions of an outer circumference of the negative electrode region, and more preferably formed in three or more directions.

In the second embodiment of the present invention, the transparent conductive layer is divided into a positive electrode region and a negative electrode connecting region. In the negative electrode connecting region, the transparent conductive layer and the negative electrode region of the metal layer are electrically connected, and the positive electrode region of the transparent conductive layer and the auxiliary electrode region of the metal layer are electrically connected.

In this second embodiment as well, the electrical connection between the auxiliary electrode region of the metal layer and the positive electrode region of the transparent conductive layer is established via a first-type connecting channel, which is an opening part in the organic light-emitting unit layer. On the other hand, the electrical connection between the negative electrode connecting region of the transparent conductive layer and the negative electrode region of the metal layer can be established by forming a second-type connecting channel, which is an opening part, in the organic light-emitting unit layer. In other words, the transparent conductive layer and the metal layer functioning as a negative electrode are electrically connected because the inside of this second-type connecting channel is filled with the metal constituting the metal layer. In this embodiment, a region where the negative electrode region and the positive electrode region overlap, that is, a region corresponding to both of the negative electrode region and the positive electrode region, constitutes a light-emitting region.

In the second embodiment, both of a connecting part to the positive electrode terminal and a connecting part to the negative electrode terminal can be provided on the transparent conductive layer. In the second embodiment, the first-type connecting channel and the transparent conductive layer dividing channel are preferably formed so that the light-emitting region is surrounded by the first-type connecting channel and the transparent conductive layer dividing channel.

Also, the organic EL light-emitting element of the present invention may have a plurality of sub light-emitting regions. Each of the sub light-emitting regions is surrounded by the first-type connecting channel and the transparent conductive layer dividing channel. It is preferable that at least one of the first-type connecting channel is formed between adjacent sub light-emitting regions. When the first-type connecting channel is formed at the boundary of the sub light-emitting regions in this manner, the distance from the first-type connecting channel in the light-emitting region will be smaller, so that the variations in brightness in the light-emitting region are further reduced.

In manufacturing an organic EL element of the present invention, the dividing channels and the connecting channels in each layer are preferably formed by laser beam irradiation. In other words, a method of manufacturing an organic EL light-emitting element of the present invention includes a step of preparing a substrate equipped with a transparent conductive layer in which the transparent conductive layer is formed on the transparent substrate; a step of forming an organic light-emitting unit layer on the transparent conductive layer; a step of forming a first-type connecting channel, from which a part in the inside of the organic light-emitting unit layer is removed, by laser beam irradiation on the organic light-emitting unit layer; a step of forming a metal layer on the organic light-emitting unit layer; and a step of forming a metal layer dividing channel, from which a part in the inside of the organic light-emitting unit layer and the metal layer is removed, by laser beam irradiation from a transparent substrate side to a metal layer side.

The metal layer is divided into a negative electrode region and an auxiliary electrode region that are electrically separated, by the metal layer dividing channel. The first-type connecting channel is formed in a region that is interposed between the transparent conductive layer and the auxiliary electrode region of the metal layer. After the first-type connecting channel is formed, the metal layer is formed thereon, whereby the inside of the first-type connecting channel is filled with a metal constituting the metal layer, thereby establishing an electrical connection between the metal layer and the transparent conductive layer.

Further, in manufacturing an organic EL light-emitting element according to the second embodiment in which the transparent conductive layer is divided into a positive electrode region and a negative electrode connecting region, the second-type connecting channel also is preferably formed by irradiating the organic light-emitting unit layer with a laser beam to remove a part in the inside of the organic light-emitting unit layer. In this case, since the metal layer is formed also on the second-type connecting channel, the inside of the second-type connecting channel is filled with the metal constituting the metal layer, thereby establishing an electrical connection between the negative electrode region of the metal layer and the negative electrode connecting region of the transparent conductive layer.

In the second embodiment, an insulating channel that serves both as the transparent conductive layer dividing channel and as the metal layer dividing channel may be formed. This insulating channel is a channel where the transparent conductive layer dividing channel and the metal layer dividing channel are formed at the same place, and is a dividing channel where all layers of the transparent conductive layer, the organic light-emitting unit layer, and the metal layer are removed. Such an insulating channel can be formed by forming a transparent conductive layer dividing channel by laser beam irradiation and thereafter forming a metal layer dividing channel by laser beam irradiation on the same site. Alternatively, the insulating channel can be formed also by radiating a laser beam so as to remove all layers of the transparent conductive layer, the organic light-emitting unit layer, and the metal layer. By such a method, the number of times for forming and processing a channel by a laser beam can be reduced.

Effect of the Invention

In the organic EL light-emitting element of the present invention, the transparent conductive layer functioning as a positive electrode is connected to the auxiliary electrode region of the metal layer via the first-type connecting channel. Since the metal layer has a lower resistance as compared with the transparent conductive layer, the influence of the voltage drop caused by a comparatively higher resistance of the transparent conductive layer is reduced, whereby generation of the variations in brightness is suppressed. In the present invention, a part of the region of the metal layer functions as a positive electrode, and the other region of the metal layer functions as an auxiliary electrode region. For this reason, generation of the variations in brightness in the surface can be suppressed without a need for providing a separate auxiliary electrode layer and without complicating the construction of the organic EL light-emitting element or the production steps.

MODE FOR CARRYING OUT THE INVENTION

Hereafter, a construction of an organic EL light-emitting element of the present invention and a method of manufacturing the same will be described with reference to the drawings.

Figure 1:
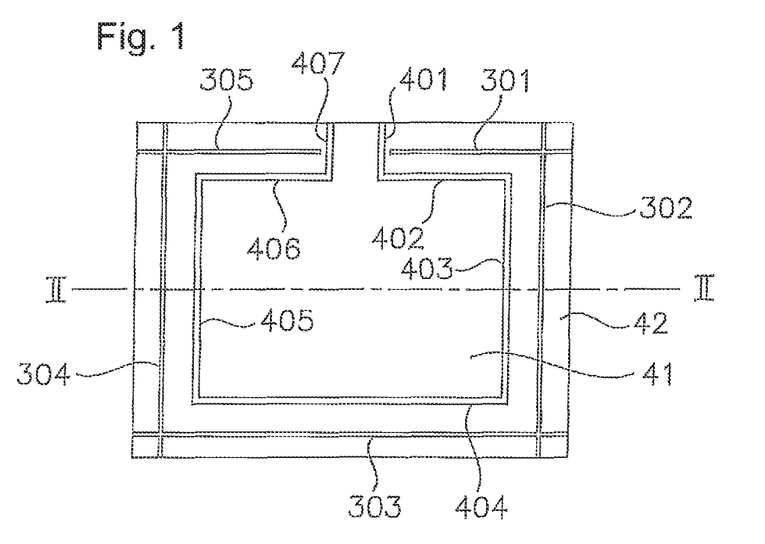
FIG. 1 is a model plan view illustrating an organic EL element according to one embodiment of the present invention.
Figure 2:
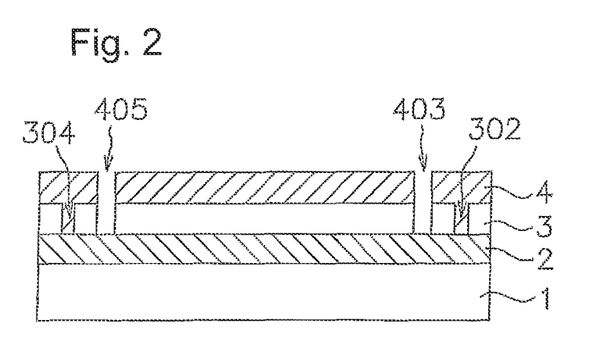
FIG. 2 is a model view illustrating a cross-section along the line II-II of FIG. 1.
Figure 3:
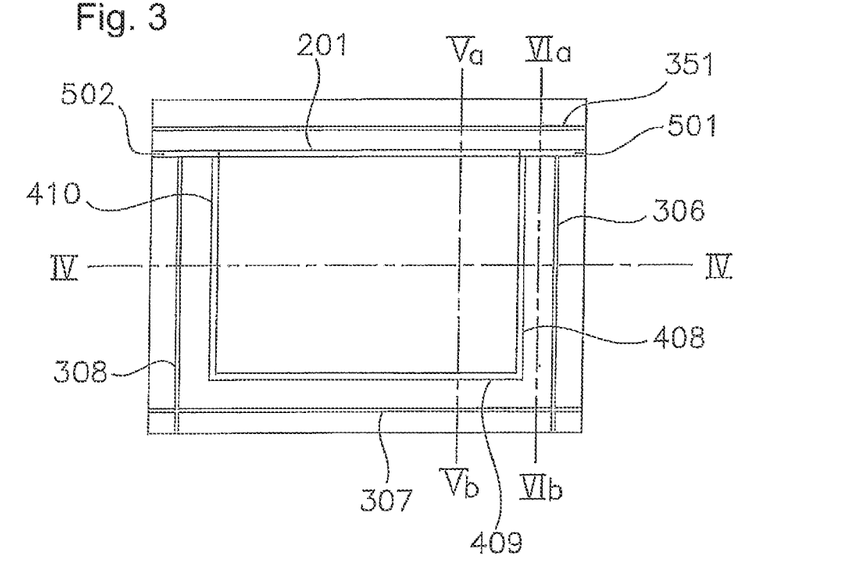
FIG. 3 is a model plan view illustrating an organic EL element according to one embodiment of the present invention.
Figure 4:
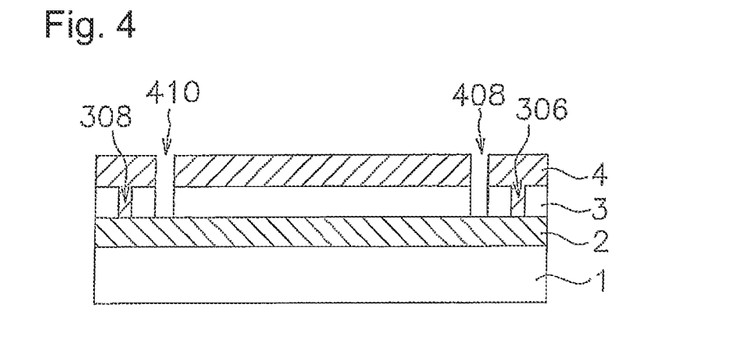
FIG. 4 is a model view illustrating a cross-section along the line IV-IV of FIG. 3.
Figure 5:
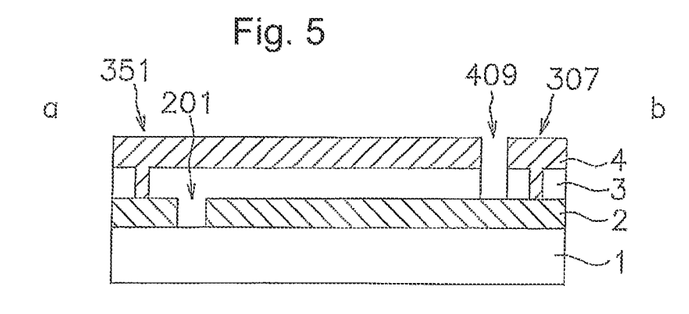
FIG. 5 is a model view illustrating a cross-section along the line Va-Vb of FIG. 3.
Figure 6:
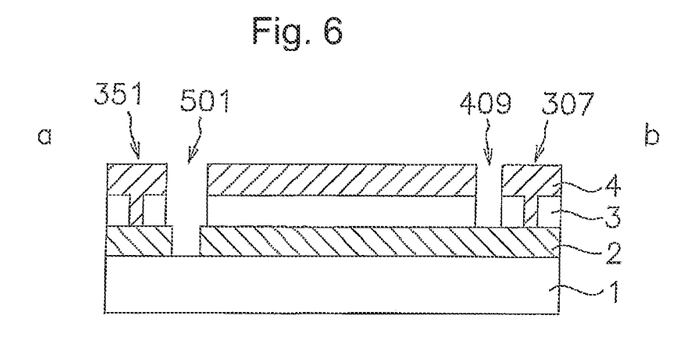
FIG. 6 is a model view illustrating a cross-section along the line VIa-VIb of FIG. 3.

FIG. 1 is a model plan view illustrating an organic EL light-emitting element according to the first embodiment of the present invention, and FIG. 2 is a model cross-sectional view illustrating a cross-section along the line II-II of FIG. 1. FIG. 3 is a model plan view illustrating an organic EL light-emitting element according to the second embodiment of the present invention. FIGS. 4, 5, and 6 are model cross-sectional views illustrating cross-sections along the lines IV-IV, Va-Vb, and VIa-VIb, respectively, of FIG. 3.

Here, in each of FIG. 1, FIG. 3, and other plan views, an element having a rectangular shape is illustrated; however, the organic EL light-emitting element of the present invention is not limited to a rectangular shape, so that the element may have a polygonal shape such as a triangle, a pentagon, or a hexagon, or various shapes such as a circular shape or a star shape.

As illustrated in the model cross-sectional views of FIGS. 2, 5, and 6, the organic EL light-emitting element of the present invention is mainly directed to an organic EL light-emitting device of what is known as a bottom emission type in which a transparent conductive layer 2 is formed on a transparent substrate 1, and an organic light-emitting unit layer 3 including an organic light-emitting layer and a metal layer 4 are formed thereon, whereby light is emitted from a transparent substrate 1 side.

In the present invention, the transparent substrate 1 is preferably as transparent as possible from the viewpoint of emitting the generated light to the outside, and a glass plate, a transparent plastic film, or the like is used as a material thereof. It is demanded that the transparent conductive layer 2 formed on the transparent substrate 1 also is light-transmitting. Here, the term "light-transmitting" means having a property of transmitting light, and specifically, it is sufficient that the transmittance in the visible light region (350 nm to 780 nm) exceeds approximately 50%. The transmittance is preferably 80% or more, and more preferably 90% or more.

The transparent conductive material constituting the transparent conductive layer 2 may be, for example, indium tin oxide (ITO), indium-doped zinc oxide (IZO), tin oxide, zinc oxide, or the like. From the viewpoint of obtaining lower surface resistance, indium tin oxide is suitably used as the transparent conductive material. As a method of forming the transparent conductive layer, sputtering, vapor deposition, pulse laser deposition, or the like is suitably used, for example.

An organic light-emitting unit layer 3 is formed on the transparent conductive layer 2. The organic light-emitting unit layer 3 refers to a part that is interposed between the positive electrode and the negative electrode in a general organic EL element, and includes, for example, an electron injection layer, an electron transport layer, a hole injection layer, a hole transport layer, and the like in addition to a light-emitting layer. The organic light-emitting unit layer may have a thin-film alkali metal layer or inorganic layer in addition to an organic compound layer. Also, the organic light-emitting unit layer may have a multiphotoemission (MPE) construction in which a plurality of light-emitting layers are connected in series in the normal line direction of the film surface via a charge generation layer (Charge Generation Layer), as disclosed in JP-A-2003-272860 or the like.

Each layer constituting the organic light-emitting unit layer 3 can be formed by a suitable method in accordance with the object or the like. For example, a low-molecular weight organic compound or the like may be formed by a vapor deposition method, and a high-molecular weight organic compound may be formed by a printing method or the like. Also, in view of suppressing deterioration of each layer constituting the organic light-emitting unit layer by moisture absorption in a step of manufacturing an organic EL light-emitting element, an electrically conductive layer may be formed as a buffer layer on the uppermost surface of the organic light-emitting unit layer 3 (the interface to the metal layer), separately from the metal layer 4.

A metal layer 4 having a lower resistance than the transparent conductive layer 2 is formed on the organic light-emitting unit layer 3. The metal layer 4 can be formed, for example, by the method of vapor deposition, sputtering, or the like using Al, Ag, or the like.

In the organic EL light-emitting element of the present invention having such a lamination construction, the transparent conductive layer 2 and the metal layer 4 constitute a pair of electrodes between which the organic light-emitting unit layer 3 is interposed. Typically, the transparent conductive layer is connected to a positive electrode terminal, and the metal layer is connected to a negative electrode terminal. However, when the transparent conductive layer 2 is divided into a positive electrode region and a negative electrode connecting region as in the second embodiment of the present invention shown in FIG. 3 or the like, the metal layer functions as a negative electrode by connecting the negative electrode terminal to the negative electrode connecting region of the transparent conductive layer 2 so as to connect the negative electrode connecting region of the transparent conductive layer 2 electrically to the negative electrode region of the metal layer 4.

Hereafter, the present invention will be described by focusing on the first embodiment of the present invention shown in a model view of FIG. 1. Referring to FIG. 1, metal layer dividing channels 401 to 407 are formed in the metal layer 4. The metal layer 4 is divided by these metal layer dividing channels into a negative electrode region surrounded by the metal layer dividing channels 401 to 407 and an auxiliary electrode region surrounding the negative electrode region. In the first embodiment of the present invention, the organic light-emitting unit layer 3 interposed between the transparent conductive layer 2 and the negative electrode region of the metal layer 4 emits light by connecting the transparent conductive layer 2 to a positive electrode terminal and connecting the negative electrode region of the metal layer 4 to a negative electrode terminal. In other words, the negative electrode region constitutes a light-emitting region. Here, in FIG. 1, the negative electrode region is formed to have a protrusion (the part between the channels 401 and 407); however, the negative electrode region does not necessarily need to have such a protrusion, and it is sufficient that the metal layer dividing channels are formed so that the negative electrode region and the auxiliary electrode region are electrically separated.

First-type connecting channels 301 to 305 are formed in the organic light-emitting unit layer 3. Referring to FIG. 2, the inside of the first-type connecting channels is filled with the metal constituting the metal layer 4. In other words, the transparent conductive layer 2 constituting the positive electrode and the auxiliary electrode region of the metal layer 4 are electrically connected via the first-type connecting channels 301 to 305, which are opening parts provided in the organic light-emitting unit layer 3. For this reason, the electric potential difference between parts closer to the connecting part connected to the positive electrode terminal and the parts located distant from the connecting part connected to the positive electrode terminal is reduced, thereby reducing the variations in brightness caused by a comparatively higher resistance of the transparent conductive layer constituting the positive electrode.

In FIG. 2, not only the metal layer 4 but also the organic light-emitting unit layer 3 is removed by the metal layer dividing channels 403 and 405. Here, in the present embodiment, the metal layer 4 and the organic light-emitting unit layer 3 are removed also in the metal layer dividing channels 401, 402, 404, 406, and 407. The metal layer dividing channels may be such that the organic light-emitting unit layer is removed, or may be such that only the metal layer 4 is removed without removing the organic light-emitting unit layer 3. It is preferable that the organic light-emitting unit layer also is removed by the metal layer dividing channels from the viewpoint of ensuring electrical separation between the negative electrode region of the metal layer and the auxiliary electrode region and from the viewpoint of facility in forming the channels by laser described later.

In FIG. 1, the first-type connecting channels 301 to 305 are formed to surround the negative electrode region; however, the first-type connecting channels need not necessarily be formed in this manner, so that the first-type connecting channels may be formed in a suitable shape so as to reduce the in-plane electric potential distribution in the transparent conductive layer by electrically connecting the auxiliary electrode region of the metal layer and the transparent conductive layer 2. For example, in FIG. 1, each of the first-type connecting channels is formed to extend to an end part of the element; however, the first-type connecting channels need not extend to an end part of the element. Also, the first-type connecting channels need not be connected with each other. The first-type connecting channels need not have a linear shape, so that the first-type connecting channels may have a curved line shape. Further, the first-type connecting channels may be formed in a dotted line shape.

From the viewpoint of reducing the in-plane electric potential distribution in the transparent conductive layer, the first-type connecting channels are preferably formed in two or more directions of an outer circumference of the negative electrode region. For example, when the element has a rectangular shape, the first-type connecting channels are preferably formed on two opposing sides of the auxiliary electrode region. Among these, the first-type connecting channels are preferably formed to surround the negative electrode region, and thereby form a light-emitting region. Here, the term "first-type connecting channels surrounding the negative electrode region" does not necessarily mean that all the first-type connecting channels are connected to constitute a closed region, so that the first-type connecting channels may have a part that is not connected, such as between the first-type connecting channels 301 and 305 in FIG. 1, between the first-type connecting channels 317 and 318 in FIG. 9, or between the first-type connecting channels 319 and 320 in FIG. 9.

In the process of manufacturing an organic EL light-emitting element of the present invention, it is preferable that the metal layer 4 is formed as a film after the first-type connecting channels, which are opening parts, are formed in the organic light-emitting unit layer 3. When the metal layer 4 is formed as a film after the first-type connecting channels are formed, the first-type connecting channels will be filled with the metal constituting the metal layer 4, so that an electrical connection between the transparent conductive layer 2 and the auxiliary electrode region of the metal layer 4 can be easily formed.

A method of patterning the organic light-emitting unit layer by forming the first-type connecting channels, which are opening parts, in the organic light-emitting unit layer 3 may be, for example, a method of forming the organic light-emitting unit layer 3 as a film in a patterned state such as by screen printing or vapor deposition using a mask, a method of forming the organic light-emitting unit layer as a film and thereafter selectively removing a part within the plane of the organic light-emitting unit layer by lift-off, RIE (reactive ion etching), photolithography, water jetting, laser beam irradiation, or the like to form the connecting channels, or a combination of these methods. Among these, from the viewpoint of precision in processing or facility of processing, the first-type connecting channels are preferably formed by laser beam irradiation.

In the case of forming the first-type connecting channels by laser beam irradiation, damage to the transparent conductive layer 2 can be suppressed when a laser beam having a wavelength that is absorbed by the organic light-emitting unit layer 3 is radiated from the organic light-emitting unit layer 3 side to the transparent substrate 1 side. On the other hand, when a conductive layer is formed as a buffer layer on the uppermost surface of the organic light-emitting unit layer 3 on the metal layer 4 side, the organic light-emitting unit layer having the conductive layer formed on the uppermost surface can be removed with a lower energy density when a laser beam having a wavelength that is absorbed by the organic light-emitting unit layer 3 is radiated from the transparent substrate 1 side to the organic light-emitting unit layer 3 side, because little light energy is absorbed by the transparent substrate 1 or the transparent conductive layer 2.

In FIG. 1, the metal layer dividing channels 401 to 407 are formed so that the ends of the dividing channels coincide with each other; however, the metal layer dividing channels need not necessarily be formed in this manner, and it is sufficient that the metal layer dividing channels are formed to divide the metal layer 4 into a negative electrode region and an auxiliary electrode region that are electrically separated. For example, the metal layer dividing channels may be formed so that the metal layer dividing channels intersect with each other. The metal layer dividing channels need not have a linear shape, so that the metal layer dividing channels may have a curved line shape. Here, from the viewpoint of suppressing generation of leakage current from the dividing channel forming parts, it is preferable that the metal layer dividing channels are formed so as not to be in contact with the first-type connecting channels or the second-type connecting channels described later.

As a method of patterning the metal layer 4 by dividing the metal layer 4 into a negative electrode region and an auxiliary electrode region by forming the metal layer dividing channels, a method similar to the one described above as a method of patterning the organic light-emitting unit layer 3 can be adopted, for example.

In the case of forming the metal layer dividing channels by laser beam irradiation, the metal layer dividing channels from which the organic light-emitting unit layer 3 and the metal layer 4 are simultaneously removed is formed when a laser beam having a wavelength that is absorbed by the organic light-emitting unit layer 3 is allowed to be incident from the transparent substrate 1 side to the metal layer 4 side. In this case, most of the light energy of the laser beam is not absorbed by the transparent substrate 1 or the transparent conductive layer 2 but is absorbed by the organic light-emitting unit layer 3. For this reason, damage to the transparent conductive layer can be suppressed when a laser beam having the minimum necessary energy density needed for removing the organic light-emitting unit layer is radiated in forming the metal layer dividing channels. The part of the organic light-emitting unit layer 3 that is irradiated with the laser beam generates heat and is evaporated by absorption of light energy, so that, as a result, not only the organic light-emitting unit layer 3 but also the metal layer 4 formed thereon are simultaneously removed.

A laser light source used in forming such metal layer dividing channels may be one that emits an oscillating laser beam having a wavelength that is absorbed by the organic light-emitting unit layer 3. For example, harmonics (wavelength of 532 nm or 355 nm) of a pulse laser using a solid crystal of YAG or YVO$_4$ to which neodymium is added as a laser medium are suitably used.

In the organic EL light-emitting element of the present invention, it is preferable to seal the light-emitting element by bonding a sealing substrate to the principal surface on the metal layer 4 side. The sealing of the light-emitting element can be carried out by a known suitable method. For example, the sealing is carried out by applying a curable resin on at least a part of the region including the light-emitting element to form a resin layer and thereafter bonding a sealing substrate on the resin layer and curing the resin layer.

The method of sealing by curing the resin may be, for example, a method of bonding a sealing substrate having a hollow structure to a substrate on which a light-emitting element has been formed and curing the resin applied on the peripheries thereof, a method of bonding a sealing substrate to a substrate on which a light-emitting element has been formed and curing the resin applied on the peripheries thereof, a method of applying a resin solution on the whole surface of a substrate on which a light-emitting element has been formed, bonding a sealing substrate thereon, and thereafter curing the resin, a method of forming an inorganic film on the whole surface of a substrate on which a light-emitting element has been formed, applying a resin on the whole surface thereof, bonding a sealing substrate thereon, and thereafter curing the resin, or the like. As the sealing substrate, glass or polymer film is used. Among these, a material having little permeability to water or oxygen is suitably used.

Next, the second embodiment of the present invention shown by a model view of FIG. 3 will be described. Here, in the following, description of the contents overlapping with those described in the first embodiment will be omitted.

In FIG. 3, a transparent conductive layer dividing channel 201 is formed in the transparent conductive layer 2. Metal layer dividing channels 408 to 410 are formed in the metal layer 4. First-type connecting channels 306 to 308 and a second-type connecting channel 351 are formed in the organic light-emitting unit layer 3. The second-type connecting channel is an opening part of the organic light-emitting unit layer in the same manner as the first-type connecting channels. In the embodiment of FIG. 3, insulating channels 501 and 502, from which all of the transparent conductive layer 2, the organic light-emitting unit layer 3, and the metal layer 4 are removed, are further formed.

The transparent conductive layer 2 is divided into a positive electrode region and a negative electrode connecting region by the transparent conductive layer dividing channel 201 and the insulating channels 501, 502. Here, in FIG. 3, the side shown lower than the transparent conductive layer dividing channel 201 and the insulating channels 501, 502 in this Figure is the positive electrode region, and the side shown on the upper side in this Figure is the negative electrode connecting region. Referring to FIG. 5, the inside of the transparent conductive layer dividing channel 201 is preferably filled with the material that forms the organic light-emitting unit layer 3, so as to provide electrical insulation between the positive electrode region and the negative electrode connecting region of the transparent conductive layer.

The metal layer 4 is divided into a negative electrode region and an auxiliary electrode region by the metal layer dividing channels 408 to 410 and the insulating channels 501, 502. In FIG. 3, the side shown above the metal layer dividing channels 408 to 410 and the insulating channels 501, 502 in the this Figure is the negative electrode region, and the lower side in this Figure is the auxiliary electrode region. As will be understood from the above, the insulating channels 501, 502 are dividing channels that serve both as the transparent conductive layer dividing channels that divide the transparent conductive layer and as the metal layer dividing channels that divide the metal layer, so that it can be said that the transparent conductive layer dividing channels and the metal layer dividing channels are formed at the same place.

In the second embodiment of the present invention, the inside of the first-type connecting channels 306 to 308 and the second-type connecting channel 351, which are opening parts in the organic light-emitting unit layer 3, is filled with the metal that constitutes the metal layer 4, as shown in FIGS. 4 to 6. For this reason, the transparent conductive layer 2 and the metal layer 4 are electrically connected via these connecting channels.

Specifically, the negative electrode connecting region of the transparent conductive layer and the negative electrode region of the metal layer are electrically connected via the second-type connecting channel 351, and the positive electrode region of the transparent conductive layer and the auxiliary electrode region of the metal layer are electrically connected via the first-type connecting channels 306 to 308. In this embodiment, the positive electrode region of the transparent conductive layer is connected to a positive electrode terminal, and the negative electrode connecting region of the transparent conductive layer is connected to a negative electrode terminal. The positive electrode region of the transparent conductive layer functions as a positive electrode. Also, since the negative electrode connecting region of the transparent conductive layer and the negative electrode region of the metal layer are electrically connected, the negative electrode region of the metal layer functions as a negative electrode. For this reason, in the region where the positive electrode region of the transparent conductive layer and the negative electrode region of the metal layer overlap with each other, the organic light-emitting unit layer interposed between the transparent conductive layer 2 and the metal layer 4 emits light. In other words, the region where the positive electrode region and the negative electrode region overlap with each other constitutes a light-emitting region.

In FIG. 3, the second-type connecting channel 351 is formed to extend to both end parts of the element; however, the second-type connecting channel need not extend to an end part of the element. Also, the second-type connecting channel need not be one channel and can be formed in a suitable shape in accordance with the shape of the negative electrode connecting region of the transparent conductive layer and the negative electrode region of the metal layer. Also, the second-type connecting channel need not have a linear shape, so that the second-type connecting channel may have a curved line shape. Further, the second-type connecting channel may be formed in a dotted line shape.

Also, in FIG. 3, the first-type connecting channels 306 to 308 are formed to surround three directions of the light-emitting region; however, the first-type connecting channels need not necessarily be formed in this manner, so that the first-type connecting channels may be formed in a suitable shape so as to reduce the in-plane electric potential distribution in the transparent conductive layer by electrically connecting the auxiliary electrode region of the metal layer and the transparent conductive layer 2. For example, a mode can be adopted in which the first-type connecting channel 307 in FIG. 3 is omitted, and the first-type connecting channels 306, 308 are formed on two opposing sides. However, from the viewpoint of reducing the in-plane electric potential distribution in the positive electrode region of the transparent conductive layer, the first-type connecting channels are preferably formed in two or more directions of an outer circumference of the negative electrode region.

In particular, in the second embodiment, the first-type connecting channels and the transparent conductive layer dividing channels are preferably formed so that the light-emitting region is surrounded by the first-type connecting channels and the transparent conductive layer dividing channels. For example, in FIG. 3, the light-emitting region is surrounded by the first-type connecting channels 306 to 308, the transparent conductive layer dividing channel 201, and the insulating channels 501, 502 that serve also as transparent conductive layer dividing channels. Since the first-type connecting channels are formed in this manner, the in-plane electric potential distribution of the transparent conductive layer in the light-emitting region is effectively reduced, whereby the variations in brightness of the light-emitting element can be further reduced.

As a method of patterning the transparent conductive layer 2 by dividing the transparent conductive layer 2 into a positive electrode region and a negative electrode connecting region by forming the transparent conductive layer dividing channels, a method similar to the one described above as a method of patterning the organic light-emitting unit layer 3 can be adopted, for example. Among these, from the viewpoint of precision in processing or facility of processing, the first-type connecting channels are preferably formed by laser beam irradiation.

In the case of forming the transparent conductive layer dividing channels by laser beam irradiation, the transparent conductive layer dividing channels are preferably formed after the transparent conductive layer 2 is formed and before the organic light-emitting unit layer 3 is formed. Damage to the transparent substrate 1 can be suppressed when a laser beam having a wavelength that is absorbed by the transparent conductive layer 2 is radiated from the transparent conductive layer 2 side to the transparent substrate 1 side. As a laser light source used in forming the transparent conductive layer dividing channels, a fundamental wave (wavelength of 1064 nm) of a pulse laser using a solid crystal of YAG or $YVO_4$ to which neodymium is added as a laser medium is suitably used, for example.

The second-type connecting channels, which are opening parts in the organic light-emitting unit layer, can be formed by a method similar to the one used in forming the first-type connecting channels. Also, from the viewpoint of simplifying the steps of manufacturing the organic EL element, the second-type connecting channels and the first-type connecting channels are preferably formed by the same method. For example, it is preferable that both of the first-type connecting channels and the second-type connecting channels are formed by laser beam irradiation after the organic light-emitting unit layer is formed.

A method of forming the insulating channels that serve both as the transparent conductive layer dividing channels and as the metal layer dividing channels may be, for example, a method of forming each layer as a film in a patterned state by screen printing, vapor deposition using a mask, or the like, a method of forming each layer or forming all layers and thereafter removing a part within the plane of the transparent conductive layer 2, the organic light-emitting unit layer 3, and the metal layer 4 by lift-off, RIE, photolithography, water jetting, laser beam irradiation, or the like to form the connecting channels, or a combination of these methods. Among these, from the viewpoint of precision in processing or facility of processing, the insulating channels are preferably formed by laser beam irradiation.

A method of forming the insulating channels by laser beam irradiation may be, for example, a method of forming the transparent conductive layer dividing channels by a first laser beam irradiation and thereafter forming the organic light-emitting unit layer 3 and the metal layer 4 and performing a second laser beam irradiation on the place where the transparent conductive layer dividing channels are formed, under the same conditions as in forming the metal layer dividing channels. In this case, after the organic light-emitting unit layer 3 and the metal layer 4 are formed and before the second laser beam irradiation is performed, the transparent conductive layer dividing channel forming part is filled with the material that forms the organic light-emitting unit layer 3 in the same manner as illustrated by the channel 201 of FIG. 5. By performing the second laser beam irradiation to overlap with this transparent conductive layer dividing channel forming part, the insulating channels that serve both as the transparent conductive layer dividing channels and as the metal layer dividing channels are formed. When the insulating channels are formed by performing laser beam irradiation twice in this manner, the width of the transparent conductive layer dividing channels formed by the first laser beam irradiation and the width of the metal layer dividing channels formed by the second laser beam irradiation may be the same or may be different. Also, the center of the transparent conductive layer dividing channels in the width direction and the center of the metal layer dividing channels in the width direction need not necessarily be the same.

Here, FIG. 6 illustrates a mode in which, with respect to the insulating channel 501, the width of the transparent conductive layer dividing channel that divides the transparent conductive layer 2 is smaller than the width of the metal layer dividing channel that divides the organic light-emitting unit layer 3 and the metal layer 4; however, the width of the transparent conductive layer dividing channel may be larger than the width of the metal layer dividing channel. For example, when a metal layer dividing channel having a smaller width than a transparent conductive layer dividing channel is formed at the center in the width direction of the transparent conductive layer dividing channel, the material of the organic light-emitting unit layer and the like adhering to the transparent conductive layer at the side wall parts of the transparent conductive layer dividing channel can contribute to insulation of the transparent conductive layer 2. For this reason, the insulating channel can be made to have more excellent insulation reliability.

Also, the transparent conductive layer, the organic light-emitting unit layer, and the metal layer can be simultaneously removed by radiating a laser beam having a wavelength that is absorbed by the transparent conductive layer 2 from the transparent substrate 1 side to the metal layer 4 side after the transparent conductive layer 2, the organic light-emitting unit layer 3, and the metal layer 4 are formed. When the transparent conductive layer, the organic light-emitting unit layer, and the metal layer are simultaneously removed in this manner, the insulating channels are formed by laser beam irradiation for one time. For this reason, the number of processing times by the laser beam irradiation is reduced, and the production steps can be simplified.

Figure 7:
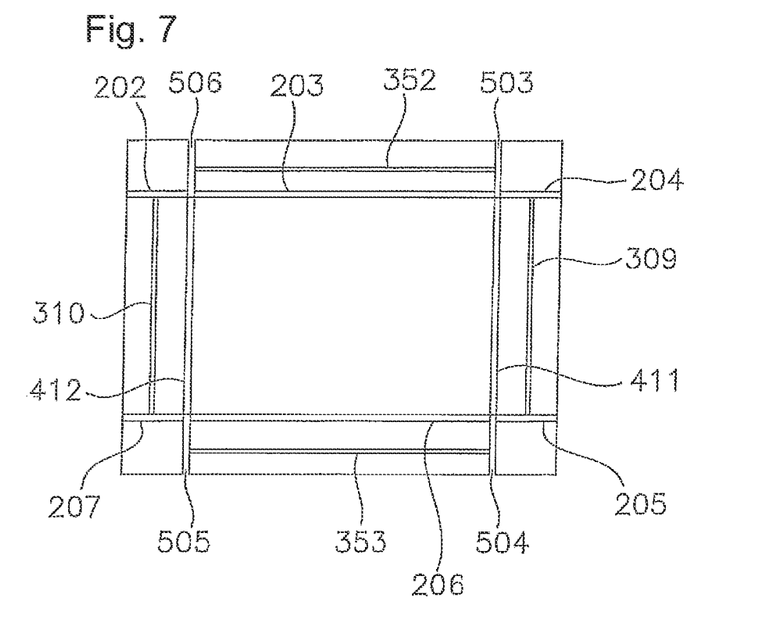
FIG. 7 is a model plan view illustrating an organic EL element according to one embodiment of the present invention.
Figure 8:
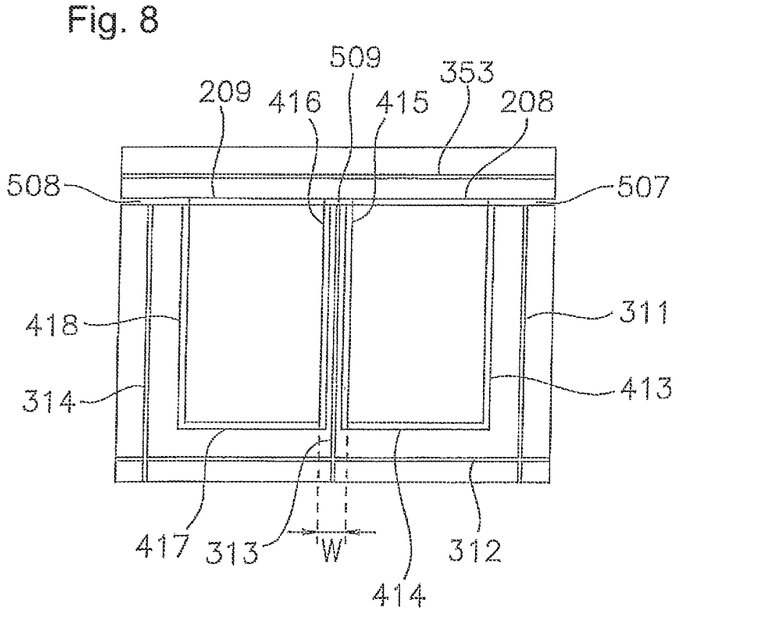
FIG. 8 is a model plan view illustrating an organic EL element according to one embodiment of the present invention.
Figure 9:
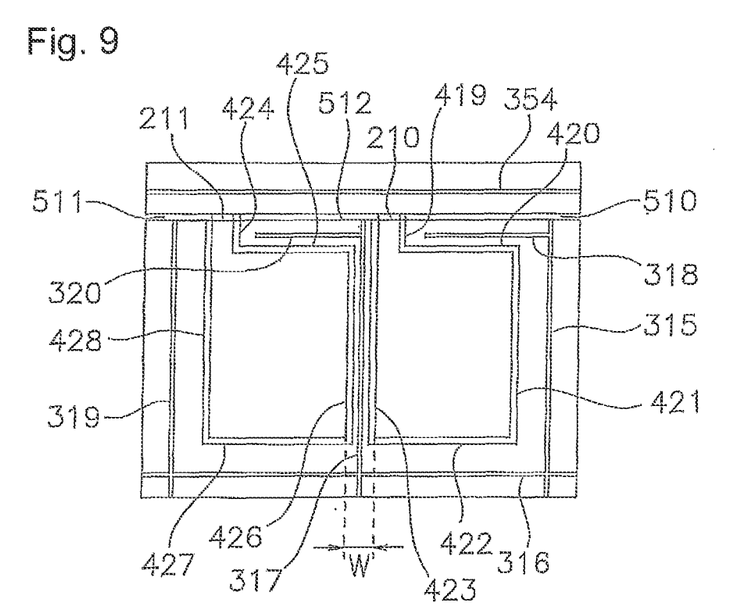
FIG. 9 is a model plan view illustrating an organic EL element according to one embodiment of the present invention.

Next, a modification of the second embodiment of the present invention shown in the model plan views of FIGS. 7 to 9 will be described. FIG. 7 is a model plan view of an organic EL element in which the transparent conductive layer 2 is patterned to have a plurality of negative electrode connecting regions, and the metal layer 4 is patterned to have a plurality of auxiliary electrode regions. FIGS. 8 and 9 are each a model plan view of an organic EL element having a plurality of light-emitting regions.

In FIGS. 7 to 9, the reference signs 202 to 211 denote transparent electrode dividing channels; the reference signs 309 to 320 denote first-type connecting channels; the reference signs 352 to 354 denote second-type connecting channels; the reference signs 411 to 428 denote metal layer dividing channels; and the reference signs 503 to 512 denote insulating channels. The mode and the method of forming each of these dividing channels and connecting channels are the same as described before.

In the embodiment shown in FIG. 7, the region between the transparent conductive layer dividing channels 202 to 204 and 205 to 207 is a positive electrode region of the transparent conductive layer 2. Further, the transparent conductive layer 2 has a first negative electrode connecting region and a second negative electrode connecting region. The first negative electrode connecting region is a region surrounded by the transparent conductive layer dividing channel 203 and the insulating channels 503, 506, and the second negative electrode connecting region is a region surrounded by the transparent conductive layer dividing channel 206 and the insulating channels 504, 505.

In the embodiment shown in FIG. 7, the region between the metal layer dividing channel 411 and insulating channels 503, 504 and the metal layer dividing channel 412 and insulating channels 505, 506 is a negative electrode region of the metal layer 4. Further, the metal layer 4 has a first auxiliary electrode region and a second auxiliary electrode region. The first auxiliary electrode region is a region separated from the negative electrode region by the metal layer dividing channel 411 and insulating channels 503, 504. The second auxiliary electrode region is a region separated from the negative electrode region by the metal layer dividing channel 412 and insulating channels 505, 506.

Each of the first auxiliary electrode region and the second auxiliary electrode region is electrically connected to the positive electrode region of the transparent conductive layer via the first-type connecting channels 309, 310 which are opening parts in the organic light-emitting unit layer. Each of the first negative electrode connecting region and the second negative electrode connecting region is electrically connected to the negative electrode region of the metal layer via the second-type connecting channels 352, 353 which are opening parts in the organic light-emitting unit layer.

Such a mode is suitable for connecting the light-emitting element to a plurality of positive electrode terminals or a plurality of negative electrode terminals. For example, in the embodiment of FIG. 7, each of the right end and the left end, shown in this Figure, of the positive electrode region of the transparent conductive layer is connected to a positive electrode terminal, and each of the upper end shown in this Figure (first negative electrode connecting region) and the lower end shown in this Figure (second negative electrode connecting region) of the transparent conductive layer is connected to a negative electrode terminal. In this manner, by making a light-emitting element symmetric in both directions of the up-and-down direction and the right-and-left direction, similar light-emitting elements can be easily formed continuously not only in one of the up-and-down direction and the right-and-left direction but also in both directions. In other words, though FIG. 7 illustrates a mode having one light-emitting region surrounded by the transparent conductive layer dividing channels 203, 206 and the metal layer dividing channels 411, 412, a light-emitting device having a plurality of light-emitting elements in a planar manner can be easily formed by adopting a mode having a plurality of light-emitting regions in each of the up-and-down direction and the right-and-left direction where an auxiliary electrode region is formed between the light-emitting regions that are adjacent to each other in the right-and-left direction, and a positive electrode connecting region is formed between two light-emitting regions that are adjacent to each other in the up-and-down direction.

In the case of adopting a mode having a plurality of light-emitting regions in this manner, the auxiliary electrode region and the positive electrode connecting region at the boundary between adjacent light-emitting regions is a non-light-emitting region, so that the width of these boundary regions is preferably made small. For example, when the metal layer dividing channels, the transparent conductive layer dividing channels, the first-type and second-type connecting channels, and the insulating channels are formed by laser beam irradiation, the width of this non-light-emitting region can be made to be as small as 500 μm or less, for example. For this reason, even in a mode having a plurality of light-emitting regions in the up-and-down direction and the right-and-left direction, the presence of the non-light-emitting region between the light-emitting regions is hardly recognizable visually, so that the design property of the light-emitting element can be enhanced.

In the embodiment shown in FIG. 8, the organic EL element has a first sub light-emitting region surrounded by the transparent conductive layer dividing channel 208 and metal layer dividing channels 413 to 415 and a second sub light-emitting region surrounded by the transparent conductive layer dividing channel 209 and metal layer dividing channels 416 to 418. Here, the parts where the transparent conductive layer dividing channels and the metal layer dividing channels intersect are all formed as insulating channels 507 to 509.

First-type connecting channels 311 to 313 are formed in three directions on the outer circumference of the first sub light-emitting region. First-type connecting channels 312 to 314 are formed in three directions on the outer circumference of the second sub light-emitting region. In an embodiment having a plurality of sub light-emitting regions in this manner, the distance from the first-type connecting channel in the light-emitting region will be smaller, as compared with an embodiment having only one light-emitting region such as illustrated in FIG. 3, because the first-type connecting channel 313 is formed between the two sub light-emitting regions. For this reason, the variations in brightness in the light-emitting region are further reduced.

In an embodiment having a plurality of sub light-emitting regions in this manner, the first-type connecting channels and the transparent conductive layer dividing channels are preferably formed so that each sub light-emitting region may be surrounded by the first-type connecting channels and the transparent conductive layer dividing channels. For example, in FIG. 8, the first sub light-emitting region is surrounded by the first-type connecting channels 311 to 313, the transparent conductive layer dividing channel 208, and the insulating channels 507, 509 that serve also as transparent conductive layer dividing channels. The second sub light-emitting region is surrounded by the first-type connecting channels 312 to 314, the transparent conductive layer dividing channel 209, and the insulating channels 507, 508 that serve also as transparent conductive layer dividing channels.

The embodiment shown in FIG. 9 is a further modification of the embodiment shown in FIG. 8, where the first-type connecting channels are formed in four directions of the outer circumference of each sub light-emitting region. The organic EL element has a first sub light-emitting region surrounded by the transparent conductive layer dividing channel 210 and the metal layer dividing channels 419 to 423 and a second sub light-emitting region surrounded by the transparent conductive layer dividing channel 211 and the metal layer dividing channels 424 to 428. Here, the parts where the transparent conductive layer dividing channels and the metal layer dividing channels intersect are all formed as insulating channels 510 to 512. The first-type connecting channels 315 to 318 are formed in four directions on the outer circumference of the first sub light-emitting region. The first-type connecting channels 316, 317, 319, 320 are formed in four directions on the outer circumference of the second sub light-emitting region.

In this manner, when the first-type connecting channels are formed in four directions of the outer circumference of the sub light-emitting regions, the variations in brightness in the light-emitting region are further reduced as compared with the embodiment shown in FIG. 8. Here, even in an embodiment where the first-type connecting channels are formed in four directions of the outer circumference of the sub light-emitting regions, the first-type connecting channels and the transparent conductive layer dividing channels are preferably formed so that each sub light-emitting region may be surrounded by the first-type connecting channels and the transparent conductive layer dividing channels.

In FIGS. 8 and 9, a mode having two sub light-emitting regions has been illustrated. By repeating a similar pattern, an organic EL light-emitting element having three or more sub light-emitting regions can be formed. Even in an embodiment having a plurality of sub light-emitting regions such as in FIGS. 8 and 9, it is preferable that each layer is patterned by laser beam irradiation. Generally, the boundary of the sub light-emitting regions is a non-light-emitting region, so that the width of the boundary regions is preferably made small. For example, in the embodiment of FIG. 8, when the metal layer dividing channels 415, 416 and the first-type connecting channel 313 between them are formed by laser beam irradiation, the width W of this non-light-emitting region can be made to be as small as 500 µm or less, for example. For this reason, when the dividing channels and the connecting channels are formed by laser beam irradiation, the presence of the non-light-emitting region between the sub light-emitting regions is hardly recognizable visually even in a mode having a plurality of sub light-emitting regions, so that the design property of the light-emitting element can be enhanced.

According to the organic EL light-emitting device of the present invention described above, generation of the variations in brightness is suppressed without providing a separate auxiliary electrode layer, because the transparent conductive layer is connected to the auxiliary electrode region of the metal layer via the first-type connecting channel. For this reason, the organic EL light-emitting device can be applied to an element having a large area without complicating the construction or manufacturing process of the organic EL light-emitting element, so that the device is suitably applied to a plane light source of illumination or the like.

EXAMPLES

Hereafter, a method of manufacturing an organic EL light-emitting element shown in a model plan view of FIG. 3 will be shown as a specific Example of the present invention; however, the present invention is not limited to such a mode. Also, by applying the method shown in the following Example, an organic EL light-emitting element of the present invention according to another embodiment can be manufactured.

Example 1

Preparation of a Substrate Equipped with a Transparent Conductive Layer and Forming a Transparent Conductive Layer Dividing Channel A non-alkali glass (200 mm×200 mm, thickness of 0.7 mm) on which an ITO film having an average film thickness of 150 nm had been formed as a transparent conductive layer on the whole of one surface was prepared. This substrate on which the ITO film had been formed was placed on an XY stage so that the ITO film surface would be an upper surface. By using a fundamental wave of a YAG laser, a part within the plane of the ITO film was removed by radiating a laser beam from the upper surface so as to impart to the glass as little damage as possible, thereby forming a transparent conductive layer dividing channel 201. The oscillation frequency of the laser was 15 kHz; the output was 14 W; the beam diameter was about 25 µm; and the processing speed was 50 mm/second.

(Forming an Organic Light-Emitting Unit Layer)

This substrate was cleaned with a neutral detergent, and heated and dried at 150° C. for 20 minutes. Thereafter, an organic light-emitting unit layer made of molybdenum oxide layer/4,4'-bis[N-(2-naphthyl)-N-phenyl-amino]biphenyl (hereafter "α-NPD") layer/α-NPD layer/aluminum (III) [tris (8-hydroxyquinolinate)] (hereafter "Alq$_3$") layer/LiF layer/AlF layer was formed on the patterned ITO film by the vacuum vapor deposition method.

In other words, on the first layer of ITO, films of molybdenum oxide and α-NPD were successively formed each to a film thickness of 10 nm by the vacuum vapor deposition method as a hole injection layer that forms a light-emitting unit. The vapor deposition speed of molybdenum was 0.015 nm/second, and the vapor deposition speed of α-NPD was 0.135 nm/second.

Subsequently, as a hole transport layer, α-NPD was formed to a film thickness of 50 nm by the vacuum vapor deposition method (vapor deposition speed of 0.08 nm to 0.12 nm/second). Thereon, Alq$_a$ was formed to a film thickness of 70 nm by the vacuum vapor deposition method as a light-emitting layer that serves also as an electron transport layer (vapor deposition speed of 0.25 nm to 0.30 nm/second). Thereon, LiF having a film thickness of 1 nm (vapor deposition speed of 0.01 nm to 0.05 nm/second) and AlF having a film thickness of 150 nm were successively formed by the vacuum vapor deposition method as buffer layers.

(Forming Connecting Channels)

This substrate on which the layers up to the organic light-emitting unit layer had been formed was placed on an XY stage so that the organic light-emitting unit layer side would be a lower surface. At that time, the substrate and the XY stage were fixed at four sites of the end parts of the substrate so that the distance between the organic light-emitting unit layer forming surface of the substrate and the XY stage would be 7 mm, so as to prevent direct contact between the laser-processed surface of the substrate and the XY stage. By performing laser processing in a state in which the substrate is floating up from the XY stage in this manner, re-adhesion of the evaporated substance produced by laser processing onto the substrate and the adverse effects by the laser light reflected and scattered at the stage can be suppressed. By radiating a laser beam from the upper surface using a second harmonic wave of a YAG laser in this state, first-type connecting channels 306 to 308 and a second-type connecting channel 351, which are opening parts in the organic light-emitting unit layer, were formed so as to impart to the glass substrate and the ITO layer as little damage as possible. The oscillation frequency of the laser was 5 kHz; the output was 0.4 W; the beam diameter was about 25 µm; and the processing speed was 50 mm/second.

(Forming a Metal Layer)

After the first-type connecting channels and the second-type connecting channel were formed, the glass substrate was placed in the vacuum vapor deposition machine again, where film of Al was formed further to a film thickness of 150 nm (vapor deposition speed of 0.30 nm to 0.35 nm/second) as a metal layer on the Al layer located at the uppermost surface by the vacuum vapor deposition method.

(Forming Metal Layer Dividing Channels)

This glass substrate on which the layers up to the metal layer had been laminated was placed on an XY stage so that the Al layer would be a lower surface. At that time, the substrate and the XY stage were fixed at four sites of the end parts of the substrate in the same manner as in the case of removing the organic light-emitting unit layer, so as to prevent direct contact between the laser-processed surface of the substrate and the XY stage. By radiating a laser beam from the upper surface using a second harmonic wave of a YAG laser, a part within the plane of the metal layer was removed together with the organic light-emitting unit layer so as to impart to the glass substrate and the ITO layer as little damage as possible, thereby to form metal layer dividing channels 408 to 410. The oscillation frequency of the laser was 5 kHz; the output was 0.4 W; the beam diameter was about 25 µm; and the processing speed was 200 mm/second.

(Forming Insulating Channels)

The insulating channels were formed under the same processing conditions as in forming the transparent conductive layer dividing channels. In other words, the glass substrate on which the layers up to the metal layer had been laminated was placed on an XY stage so that the Al layer would be an upper surface. By using a fundamental wave of a YAG laser, the ITO film, the organic light-emitting unit layer, and the metal layer were simultaneously removed by radiating a laser beam from the upper surface, thereby to form insulating channels 501 and 502. The oscillation frequency of the laser was 15 kHz; the output was 14 W; the beam diameter was about 25 µm; and the processing speed was 50 mm/second.

Example 2

In Example 2, an organic EL light-emitting element shown by a model plan view of FIG. 3 was manufactured in the same manner as in Example 1; however, Example 2 is different from Example 1 in that the insulating channels 501 and 502 were formed by carrying out laser beam irradiation twice.

First, in the same manner as in Example 1, the substrate on which the ITO film had been formed was placed on an XY stage so that the ITO film surface would be an upper surface. By using a fundamental wave of a YAG laser, a part within the plane of the ITO film was removed. At this time, the ITO film was removed by laser processing at places corresponding to the insulating channels 501 and 502 in addition to the transparent conductive layer dividing channel 201 (first laser beam irradiation).

Thereafter, in the same manner as in Example 1, forming the organic light-emitting unit layer, forming the connecting channels, and forming the metal layer were carried out. This glass substrate on which the layers up to the metal layer had been laminated was placed on an XY stage so that the Al layer would be a lower surface in the same manner as in Example 1. By radiating a laser beam from the upper surface using a second harmonic wave of a YAG laser, a part within the plane of the metal layer was removed together with the organic light-emitting unit layer, thereby to form metal layer dividing channels 408 to 410. Also, similar laser beam irradiation was carried out at places corresponding to the insulating channels 501 and 502. In other words, by performing a second laser beam irradiation at the place where the ITO film had been removed previously by the first laser beam irradiation, the organic light-emitting unit layer and the metal layer were removed to form insulating channels 501 and 502. When the insulating channels are formed in this manner, there is no need to reposition the substrate on the stage for forming the insulating channels as in the case of Example 1, thereby being advantageous in processability.

DESCRIPTION OF REFERENCE CHARACTERS 1 transparent substrate
2 transparent conductive layer
3 organic light-emitting unit layer
4 metal layer
201 to 211 transparent conductive layer dividing channels
301 to 320 first-type connecting channels
351 to 354 second-type connecting channels
401 to 428 metal layer dividing channels
501 to 512 insulating channels

The invention claimed is:

1. An organic EL light-emitting element comprising a transparent conductive layer, an organic light-emitting unit layer, and a metal layer in this order on a transparent substrate, wherein
  the metal layer is divided into a negative electrode region and an auxiliary electrode region that are electrically separated by a metal layer dividing channel;
  the organic EL light-emitting element includes a first-type connecting channel filled with a metal constituting the metal layer, the first-type connecting channel having a first surface positioned on a side closer to the transparent substrate, the first surface being in contact with the transparent conductive layer, a second surface positioned on a side farther from the transparent substrate than a distance of the first surface from the transparent substrate, the second surface being in contact with the auxiliary electrode region, and a side surface connecting the first surface and the second surface to each other, the side surface being in contact with the organic light-emitting unit layer;
  the transparent conductive layer is divided into a positive electrode region and a negative electrode connecting region that are electrically separated by a transparent conductive layer dividing channel;
  in the negative electrode connecting region, the transparent conductive layer and the negative electrode region of the metal layer are electrically connected via a second-type connecting channel, which is an opening part in the organic light-emitting unit layer;
  the positive electrode region of the transparent conductive layer and the auxiliary electrode region of the metal layer are electrically connected via the first-type connecting channel; and
  a region where the positive electrode region and the negative electrode region overlap constitutes a light-emitting region;
  the organic EL light-emitting element further comprising an insulating channel that serves both as the transparent conductive layer dividing channel and as the metal layer dividing channel, where the transparent conductive layer dividing channel and the metal layer dividing channel are formed in a same region, wherein in the insulating channel, all layers of the transparent conductive layer, the organic light-emitting unit layer, and the metal layer are removed.

2. The organic EL light-emitting element according to claim 1, wherein the first-type connecting channel and the transparent conductive layer dividing channel are formed so that the light-emitting region is surrounded by the first-type connecting channel and the transparent conductive layer dividing channel.

3. An organic EL light-emitting element comprising a transparent conductive layer, an organic light-emitting unit layer, and a metal layer in this order on a transparent substrate, wherein the metal layer is divided into a negative electrode region and an auxiliary electrode region that are electrically separated by a metal layer dividing channel;

the organic EL light-emitting element includes a first-type connecting channel filled with a metal constituting the metal layer, the first-type connecting channel having a first surface positioned on a side closer to the transparent substrate, the first surface being in contact with the transparent conductive layer, a second surface positioned on a side farther from the transparent substrate than a distance of the first surface from the transparent substrate, the second surface being in contact with the auxiliary electrode region, and a side surface connecting the first surface and the second surface to each other, the side surface being in contact with the organic light-emitting unit layer;

the transparent conductive layer is divided into a positive electrode region and a negative electrode connecting region that are electrically separated by a transparent conductive layer dividing channel;

in the negative electrode connecting region, the transparent conductive layer and the negative electrode region of the metal layer are electrically connected via a second-type connecting channel, which is an opening part in the organic light-emitting unit layer;

the positive electrode region of the transparent conductive layer and the auxiliary electrode region of the metal layer are electrically connected via the first-type connecting channel; and a region where the positive electrode region and the negative electrode region overlap constitutes a light-emitting region;

the organic EL light-emitting element further comprising a plurality of sub light-emitting regions that are surrounded by the first-type connecting channel and the transparent conductive layer dividing channel, wherein the first-type connecting channel is formed between adjacent sub light-emitting regions.

* * * * *